United States Patent [19]

Hoffmann

[11] Patent Number: 5,172,067

[45] Date of Patent: Dec. 15, 1992

[54] APPARATUS FOR DETERMINING DC RESISTANCE IN HIGH VOLTAGE WINDING WITH NONLINEAR RESISTANCE ENERGY DISSIPATION CIRCUIT

[75] Inventor: Willard G. Hoffmann, Glenview, Ill.

[73] Assignee: Commonwealth Edison Company, Chicago, Ill.

[21] Appl. No.: 702,313

[22] Filed: May 20, 1991

[51] Int. Cl.$^5$ .................. G01R 31/06; H02H 3/22
[52] U.S. Cl. .................. 324/713; 324/546; 324/547; 324/726; 361/212
[58] Field of Search ........... 324/388, 546, 547, 605, 324/609, 713, 728; 361/126, 140, 212

[56] References Cited

U.S. PATENT DOCUMENTS

| | | | |
|---|---|---|---|
| 3,526,830 | 9/1968 | Azuma | 324/546 |
| 3,562,902 | 2/1971 | Green | 324/546 X |
| 3,659,197 | 4/1972 | Alley et al. | 324/546 |
| 3,742,346 | 6/1973 | Specht . | |
| 3,823,369 | 7/1974 | Sinha . | |
| 3,932,806 | 6/1976 | Kawada | 324/546 |
| 4,152,640 | 5/1979 | Craig | 324/546 |
| 4,538,771 | 9/1985 | Tardy | 324/546 X |
| 4,658,213 | 4/1987 | Finley . | |
| 4,746,869 | 5/1988 | Schrag et al. | 324/546 |

Primary Examiner—Gerard R. Strecker
Assistant Examiner—Diep Do
Attorney, Agent, or Firm—Emrich & Dithmar

[57] ABSTRACT

Apparatus for testing a high voltage inductive coil such as a transformer winding applies a DC voltage to the coil and measures coil voltage and current from which its resistance can be calculated. A load resistor in a discharge circuit dissipates energy stored in the coil prior to test apparatus removal to reduce arcing for operator safety. Diode bridges in the discharge circuit provide a nonlinear resistance which increases with decreasing voltage and current to ensure rapid and complete discharge of the energy stored in the coil's magnetic field. A three position make-before-break switch includes first and third positions for respectively coupling the DC supply and the discharge circuit to the coil and an intermediate position for simultaneously coupling the DC supply and the discharge circuit to the coil for safely initiating coil discharge. The test apparatus is coupled to the transformer via two modified Mueller clips using only three conductors each and is adapted for use with a 12 volt automobile battery without removing it from the vehicle.

18 Claims, 2 Drawing Sheets

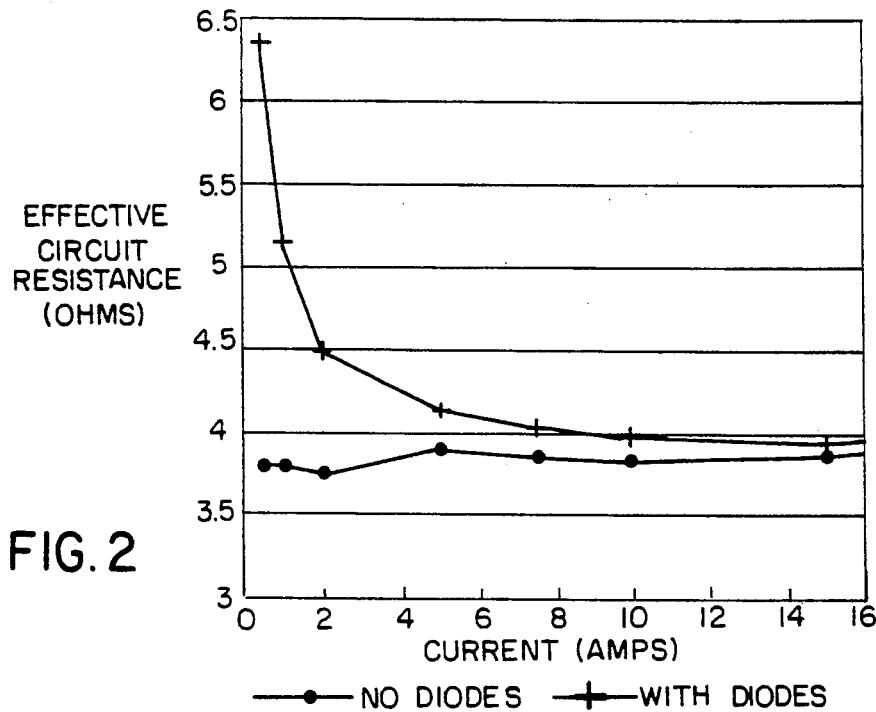
FIG. 2
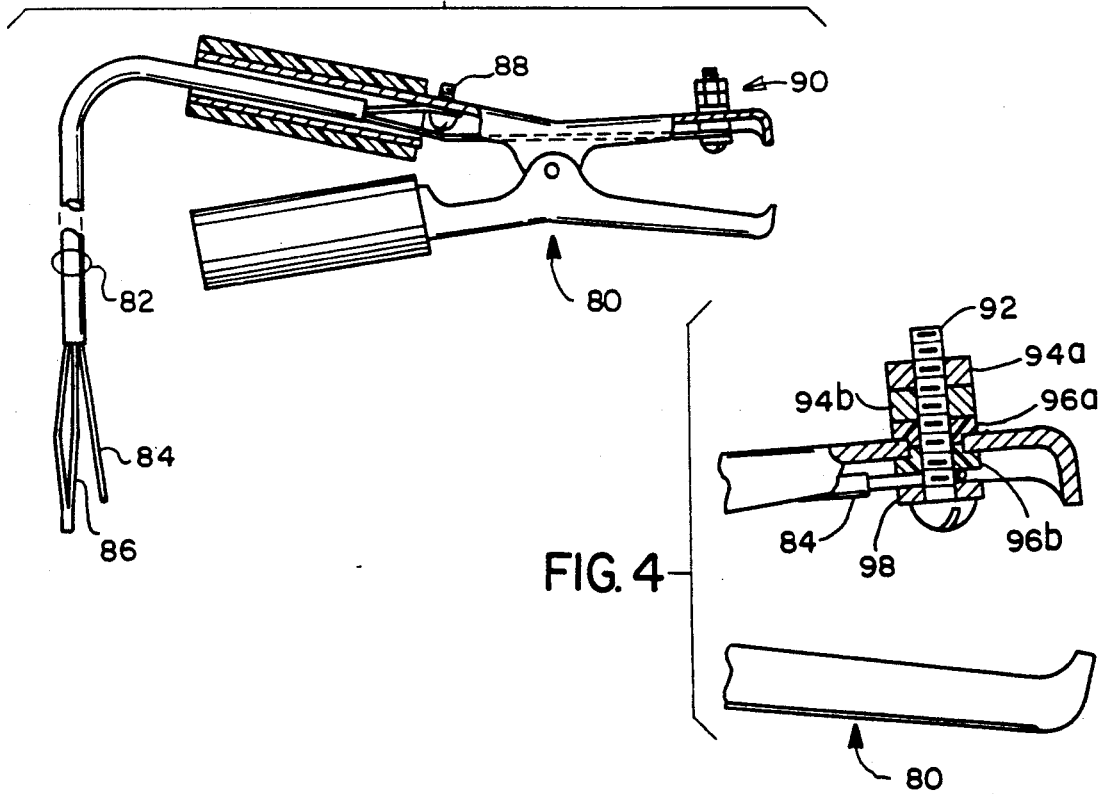

APPARATUS FOR DETERMINING DC RESISTANCE IN HIGH VOLTAGE WINDING WITH NONLINEAR RESISTANCE ENERGY DISSIPATION CIRCUIT

FIELD OF THE INVENTION

This invention relates generally to the testing of high voltage inductive windings such as used in transformers, inductors (also called reactors) and electric motors and is particularly directed to apparatus for testing the DC resistance of a high voltage transformer winding such as used by electric utilities.

BACKGROUND OF THE INVENTION

High voltage windings are used in various applications such as in transformers, DC motors and electrical inductors. Large energies are stored in such windings in the form of a magnetic field. Because of the large stored energy, testing of these windings is difficult and frequently hazardous. For example, it is desirable to test a high voltage power transformer such as used in an electric power station during installation and before it is placed in operation. This helps ensure that the transformer will operate properly. Shipping damage and manufacturing defects can sometimes be found with a DC resistance test. Appropriate electrical meters are typically connected to leads on the winding and a DC voltage is applied to the winding. Because of the winding's inductance, several minutes are required for the current to stabilize at a constant value. After voltage and current readings are taken, the DC voltage source is shut-down leaving residual energy stored in the magnetic field of the winding. The residual energy should be allowed to dissipate prior to complete removal of the battery from the winding for safety reasons and to protect test equipment. Typically, the meters are disconnected from the winding before the magnetic field is dissipated. When the battery is disconnected, an arc on the order of 3-4 inches is produced. This is not only extremely hazardous to the worker testing the winding, but sometimes results in damage to or destruction of the metering devices.

OBJECTS AND SUMMARY OF THE INVENTION

Accordingly, it is an object of the present invention to provide for the safe testing of high voltage inductive windings.

Another object of the present invention is to provide apparatus for determining the DC resistance of a high voltage transformer winding such as used by electric utilities by measuring the voltage and current in the winding.

Yet another object of the present invention is to provide apparatus which affords increased safety in the testing of a high voltage winding or coil by rapidly and completely discharging energy stored in the magnetic field of the winding prior to removal of the apparatus from the winding being tested.

A further object of the present invention is to provide high voltage winding test apparatus including a make-before-break transfer switch and internal load resistance for rapidly and completely discharging large energies stored in the magnetic field of the winding prior to removing the test apparatus from the winding.

A still further object of the present invention is to provide inexpensive, safe and easily used apparatus for testing the DC resistance of a high voltage winding which makes use of a vehicle storage battery without removing the battery from the vehicle.

It is another object of the present invention to provide a high voltage winding test apparatus which is particularly adapted for use in the field by electric power utilities in the testing of high voltage transformers.

This invention contemplates apparatus for determining DC resistance of a high voltage inductive winding by measuring direct current and DC voltage in the winding, the apparatus comprising: a storage battery providing a DC voltage output; a three position switch for coupling the storage battery to the winding for applying the DC voltage to the winding when the switch is in a first position; current and voltage measuring devices coupled to the winding for respectively measuring direct current and DC voltage in the winding for determining the DC resistance of the winding; and a resistive energy dissipation circuit connected to the switch and coupled to the winding together with the storage battery when the switch is in a second, intermediate position for initiating discharge of the winding and for completely discharging the winding when the switch is in a third position, wherein the storage battery is disconnected from the winding, and wherein the dissipation circuit is characterized by a nonlinear resistance which increases with decreasing current and voltage in the winding to facilitate full discharge of the winding without arcing.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 2 is a graphic illustration of the variation of effective resistance with current of the energy dissipation circuit of a DC resistance tester in accordance with the present invention;

FIG. 3 is a simplified sectional view showing details of a clamp used in attaching a DC resistance test apparatus in accordance with the present invention to a tap of a high voltage winding for testing; and FIG. 4 is an enlarged view of a portion of the clamp shown in FIG. 3.

DETAILED DESCRIPTION OF THE INVENTION

Figure 1:
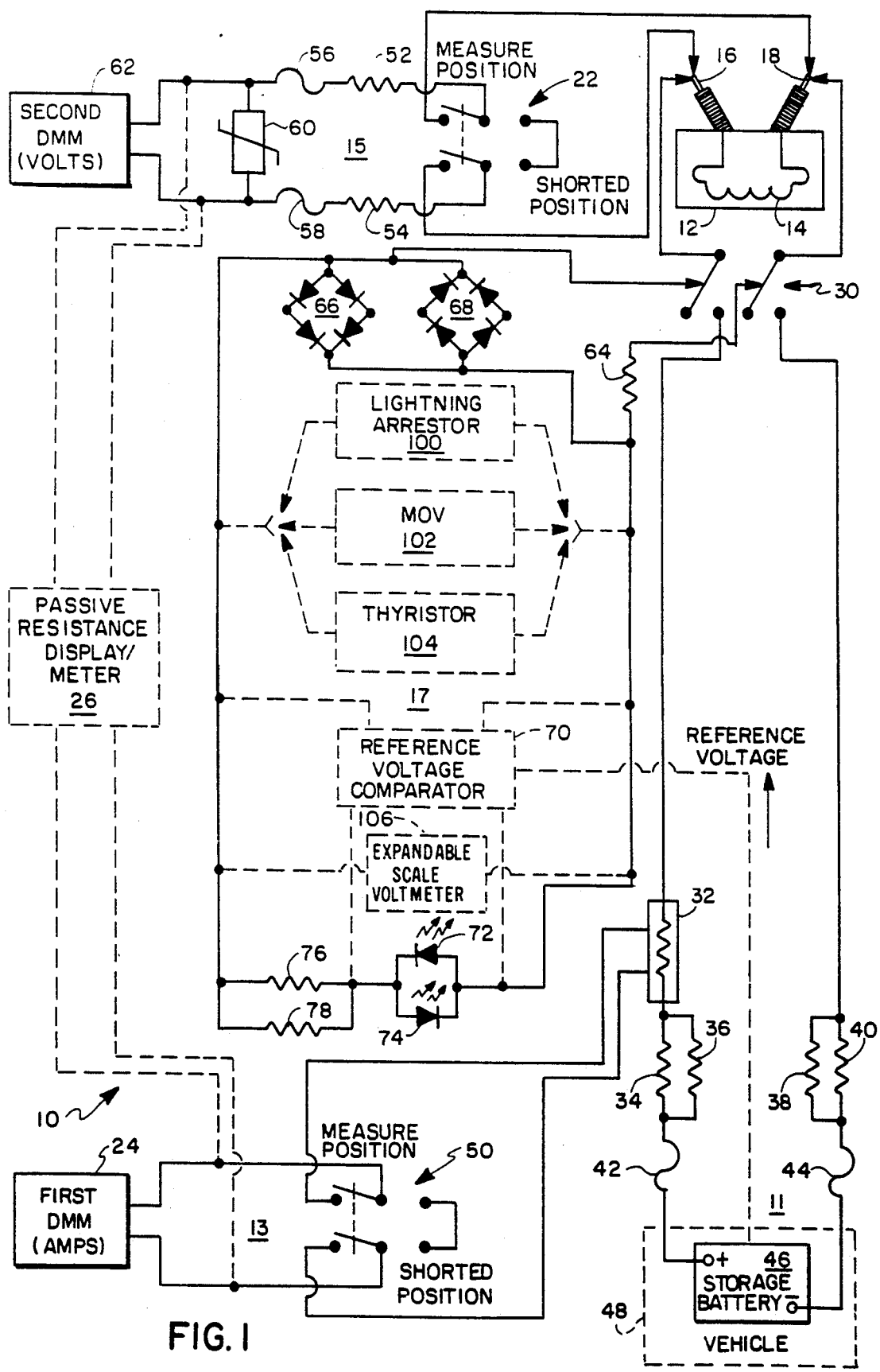
FIG. 1 is a combined block and schematic diagram of high voltage winding DC resistance test apparatus in accordance with the present invention.

Referring to FIG. 1, there is shown a simplified combined schematic and block diagram of a high voltage winding DC resistance tester 10 in accordance with the present invention. The test apparatus 10 is adapted for determining the DC resistance of a winding 14 such as of a high voltage transformer 12 by measuring the current and DC voltage in the winding from which its resistance can easily be determined using Ohm's law. The DC resistance tester 10 is not limited to the testing of a transformer winding, but is adapted for testing the DC resistance of virtually any type of high voltage inductive winding such as in an electric motor or electrical inductor. The DC resistance tester 10 includes a power supply circuit 11, a current metering circuit 13, a voltage metering circuit 15, and an energy dissipation/display circuit 17. Each of the aforementioned circuits is coupled to the transformer 12 by appropriate switches as described in detail below.

The power supply circuit 11 is coupled to first and second leads 16 and 18 of the transformer winding 14 by means of a three-position make-before-break transfer switch 30. A multi-position switch may be used and is equivalent to a three position switch in this application. Power supply circuit 11 includes a storage battery 46 such as of the lead-acid type commonly used in vehicles 48, such as automobiles and trucks. The make-before-break transfer switch 30 is coupled to the positive and negative terminals of storage battery 46 by means of a first pair of parallel resistors 34 and 36, a second pair of parallel resistors 38 and 40, as well as and first and second fuses 42 and 44. When in a first switch position, the make-before-break transfer switch 30 connects the power supply circuit 11 to the transformer winding 14 for providing a DC voltage to the winding. In a second intermediate position, the make-before-break transfer switch 30 connects both the power supply circuit 11 and the energy dissipation/display circuit 17 to the transformer winding 14. In this switch position discharge of energy stored in the winding magnetic field to the energy dissipation/display circuit 17 is initiated. In a third switch position, the make-before-break transfer switch 30 connects only the energy dissipation/display circuit 17 to transformer winding 14 for fully discharging the winding. Parallel sets of resistors 34, 36 and 38, 40 perform a current limiting function, while fuses 42 and 44, which preferably are rated at 30 amps, also limit the maximum current provided from the storage battery 46 to transformer winding 14. Each of the four resistors 34, 36, 38 and 40 is provided with a value of 0.2 ohms in a preferred embodiment, although each pair of resistors could be replaced by one resistor with a resistance of 0.1 ohms. With the storage battery 46 coupled to transformer winding 14, the vehicle 48 should not be operated during testing because the vehicle's voltage regulator (not shown) will introduce extraneous inputs giving rise to erroneous readings. The battery leads connecting the storage battery 46 to the transformer winding 14 are preferably two conductor/no. 14 copper wire which are coupled to the storage battery terminals by conventional means such as alligator clips.

Also coupled to the transformer winding 14 via switch 30 by means of a shunt resistor 32 is the current metering circuit 13. The current metering circuit includes a first digital multimeter (DMM) 24 for measuring the current in transformer winding 14 and a knife-type, double pole/double throw switch 50. With switch 50 in a first shorted position, the first DMM 24 is disconnected from transformer winding 14. With switch 50 in a second measure position, the first DMM 24 is coupled in circuit with transformer winding 14 via shunt resistor 32 for measuring the current flowing through the transformer winding. In a preferred embodiment a current of 50 amps flowing through shunt resistor 32 produces a voltage drop of 50 millivolts. A first DMM 24 where a voltage of 1 millivolt shows a reading of 1 amp is used in the preferred embodiment. An appropriately scaled first DMM 24 may be used if a different shunt resistor is used.

Also coupled to transformer winding 14 at its first and second leads 16, 18 is the voltage metering circuit 15. The voltage metering circuit 15 also includes a knife-like, double pole/double throw switch 22. With switch 22 in the measure position, a second digital multimeter (DMM) 62 is coupled to transformer winding 14 for measuring the voltage therein. With switch 22 in the shorted position, the voltage metering circuit 15 including second DMM 62 is disconnected from transformer winding 14. Voltage metering circuit 15 further includes a pair of resistors 52, 54 and fuses 56, 58. Resistors 52 and 54 serve a current limiting function, while fuses 56 and 58, which preferably are rated at 1 amp, limit the maximum current provided to the second DMM 62. A metal oxide varistor (MOV) 60 is coupled across the leads to the second DMM 62 for introducing a short in the circuit at excess voltages across the MOV for limiting the voltage across and the current through the second DMM.

In place of first DMM 24 and second DMM 62, a passive resistance display/meter 26 may be used as a single current/voltage measuring means which is shown in dotted line form as coupled in circuit in the DC resistance tester 10 of the present invention. The passive resistance display/meter 26 measures the current flowing through and the voltage across transformer winding 14 as do the first and second DMMs 24, 62. Instead of displaying current and voltage as do the first and second DMMs 24, 62, the passive resistance display/meter 26 calculates DC winding resistance according to Ohm's Law and displays said calculated resistance relieving the operator from making this calculation.

Also coupled to the transformer winding 14 via make-before-break transfer switch 30 is the energy dissipation circuit 17. Energy dissipation circuit 17 includes a pair of diode bridges 66 and 68 coupled across the leads to the energy dissipation circuit. Each of the diode bridges 66 and 68 includes four diodes coupled together in a conventional rectifying bridge arrangement. The energy dissipation circuit 17 further includes a discharge load resistor 64, a pair of reverse connected light emitting diodes (LEDs) 72 and 74, and a pair of parallel coupled current limiting resistors 76 and 78.

As described above, transformer winding 14 is initially energized by means of the power supply circuit 11 with the make-before-break transfer switch 30 in a first closed position. Current in transformer winding 14 starts to increase. After transformer winding 14 current reaches a constant value and a steady state is achieved, transfer switch 30 is moved to a second intermediate position wherein the power supply circuit 11 as well as the energy dissipation circuit 17 are both coupled to transformer winding 14. In this position, current flow is initiated from transformer winding 14 to the energy dissipation circuit 17, and particularly to load resistor 64, in initiating transformer winding discharge. Transfer switch 30 is then moved from the second, intermediate position to a third position in which the power supply circuit is disconnected from transformer winding 14 which is then only connected to the energy dissipation circuit 17. With transfer switch 30 in this third position, transformer winding 14 is forced to discharge. Load resistor 64 quickly discharges the energy stored in transformer winding 14. The diodes in bridges 66 and 68 have a non-linear resistance characteristic, wherein resistance increases as voltage and current decrease. Thus, as transformer winding 14 discharges into the energy dissipation circuit 17, the increasing resistance of the diodes in the first and second bridges 66 and 68 ensures quick and complete dissipation of the winding energy as the current in the circuit approaches zero. By thus coupling load resistor 64 across transformer winding 14, the energy stored in the transformer winding is more rapidly and completely discharged and dissipated allowing the DC resistance tester 10 to be more safely removed from the transformer 12 following testing. Silicon diodes with a forward voltage drop of approximately 0.7 volt are used in the preferred embodiment. Diode bridges 66 and 68 are preferably rated at 50 volts/25 amps. Components other than the diodes in the first and second bridges 66 and 68 may be used in the energy dissipation circuit 17 to cause an increase in the rate of energy discharge at low discharge currents. These components includes low voltage lightning arresters 100, MOVs 102, thyristors 104, etc., as shown in dotted line form in FIG. 1.

During discharge of transformer winding 14 and with a voltage applied across load resistor 64, LEDs 72 and 74 provide a visual indication of transformer winding discharge. When transformer winding 14 is fully discharged and there is no current flowing through or voltage across loading resistor 64, LEDs 72 and 74 are turned off and provide a visual indication that winding discharge is terminated. A pair of parallel coupled resistors 76 and 78 provide current limiting for the back-to-back coupled LEDs 72 and 74.

Shown in dotted-line form in FIG. 1 within the energy dissipation circuit 17 is another embodiment of the present invention. This embodiment employs a reference voltage comparator 70 for comparing the voltage provided to the energy dissipation circuit 17 from the discharging transformer winding 14 with a reference voltage. When the output voltage from transformer winding 14 exceeds the reference voltage, the comparator circuit 70 outputs a turn-on signal to LEDs 72 and 74 to provide a visual indication of winding discharge. When the output voltage of winding 14 is less than the reference voltage, LEDs 72 and 74 turn off providing a visual indication of essentially full discharge of the transformer winding. A small reference voltage may be selected to ensure the essentially complete discharge of transformer winding 14 prior to turn-off of the LEDs 72 and 74. In the embodiment incorporating the aforementioned reference voltage comparator 70, current limiting resistors 76 and 78 would be eliminated from the circuit. A reference voltage could be derived from the storage battery 46 and provided to the reference voltage comparator 70 in the latter embodiment as shown in dotted-line form.

Alternatively, an expandable scale voltmeter 106 shown in dotted line form in FIG. 1 may be used to provide a visual indication of essentially full discharge of the transformer winding. When the output voltage of transformer winding 14 exceeds the reference voltage, the expandable scale voltmeter 106 would show a voltage reading. As winding 14 discharges its energy, the voltage decays. The voltage scale automatically contracts to a low range voltage scale until the voltage indication drops to zero, indicating that the transformer winding voltage is less than the reference voltage.

Referring to FIG. 2, there is shown a graphic illustration taken from test data of the variation of effective resistance with current within the energy dissipation circuit 17 of the high voltage winding DC resistance test apparatus 10. FIG. 2 shows that without the diodes in the two diode bridges 66 and 68 present, resistance in the energy dissipation circuit 17 remains essentially unchanged. In accordance with Ohms Law, the resistance within the energy dissipation circuit 17 equals $V_{IN}/I_{IN}$, where $V_{IN}$ is the voltage across and $I_{IN}$ is the current flowing through the energy dissipation circuit 17. From the figure it can be seen that the resistance of the energy dissipation circuit 17 increases dramatically with the diode bridges 66 and 68 present in the circuit with decreasing current ($I_{IN}$). This is shown by the increasing resistance at the lower end of the upper curve in FIG. 2. This substantial increase in circuit resistance causes a more rapid and complete discharge of winding stored energy. Although the data shown in FIG. 2 is for an alternating current source, the increasing resistance characteristic of the energy dissipation circuit 17 is equally representative of its use with a direct current with which the present invention is intended for use.

Referring to FIG. 3, there is shown a Mueller clamp 80 modified to operate with the high voltage winding DC resistance tester 10 of the present invention. The Mueller clamp 80 was modified to provide connections for both the current supply/measuring circuit and the potential measuring circuit using a single clamp for each end of the winding, or coil, under test. Clamp 80 includes a pair of pivotally coupled members, each having a handle portion at a first end and a winding engaging portion at its other end. A three conductor no. 16 copper wire 82 is coupled to one element of clamp 80 and is sized for maximum mechanical flexibility. Wire 82 includes a pair of current supply leads 86 and a potential measuring lead 84. The two current supply leads 86 are coupled to clamp 80 by means of a connecting screw 88 which couples the current supply leads to a copper conductor of the clamp. The current supply leads 86 and the potential measuring lead 84 terminate in a twist-lock type plug in a preferred embodiment for coupling to make-before-break transfer switch 30 shown in FIG. 1.

Details of a voltage measurement lead coupling arrangement 90 for connecting lead 84 to clamp 80 are shown in FIG. 4. Potential measuring lead 84 is coupled to one element of the clamp 80 by means of a screw 92 securely attached to the clamp by means of a pair of nuts 94a and 94b. First and second nylon insulating washers 96a and 96b disposed on opposed sides of the clamp are also attached to screw 92 to prevent arcing between the clamp and various connector elements. A metal washer 98 engages both screw 92 and the end of potential measuring lead 84 to establish good electrical contact between the screw and conductor. The other end of each potential lead 84 is coupled to double pole/double throw switch 22. The single clamp arrangement shown in FIGS. 3 and 4 provides an electrical connection with a lead of a high voltage inductive winding which allows for measuring both current and potential in the winding. This single clamp arrangement provides highly accurate voltage and current measurements by cancelling out lead resistance.

There has thus been shown test apparatus particularly adapted for testing the DC resistance of a high voltage winding such as used in a transformer, electric motor, electric inductor, etc. The test apparatus includes a DC supply coupled to the winding by means of a switch which also couples a current measuring circuit and an energy dissipation circuit to the winding. Also coupled to leads of the winding is a voltage measuring circuit.

The energy dissipation circuit includes a load resistor for dissipating energy stored in the winding which exhibits a resistance characteristic which increases with decreasing current and voltage. The increasing resistance of the energy dissipation circuit at low currents and voltages ensures complete and rapid discharge of winding inductance to essentially eliminate the possibility of high voltage arcing when the test apparatus is disconnected from the winding. The test apparatus employs a conventional vehicle mounted storage battery and includes a visual indication of high voltage winding discharge for user safety.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. Apparatus for determining DC resistance of a high voltage inductive winding by measuring direct current and DC voltage in the winding, said apparatus comprising:
   a storage battery providing a DC voltage output;
   three position switch means for coupling said storage battery to the winding for applying the DC voltage to the winding when said switch means is in a first position;
   current and voltage measuring means coupled to the winding by means of said switch means for respectively measuring direct current and DC voltage in the winding when said switch means is in said first position for determining the DC resistance of the winding; and
   a resistive energy dissipation circuit connected to said switch means and coupled to the winding together with said storage battery when said switch means is in a second, intermediate position for initiating discharge of the winding and for completely discharging the winding when said switch means is in a third position, wherein said storage battery is disconnected from the winding, and wherein said dissipation circuit is characterized by a nonlinear resistance which increases with decreasing current and voltage in the winding to facilitate full discharge of the winding without arcing.

2. The apparatus of claim 1, wherein said energy dissipation circuit includes a load resistor coupled to the inductive winding.

3. The apparatus of claim 2, wherein said energy dissipation circuit further includes a plurality of diodes coupled to said load resistor for increasing dissipation circuit resistance as the voltage and current in the winding decrease for rapidly and completely discharging the winding.

4. The apparatus of claim 2, wherein said diodes comprise a pair of rectifying bridge circuits.

5. The apparatus of claim 3, wherein said energy dissipation circuit further includes display means for providing a visual indication of the discharging of the winding.

6. The apparatus of claim 5, wherein said display means includes at least one light emitting diode (LED).

7. The apparatus of claim 6 further comprising comparator means for comparing the voltage across said load resistor with a reference voltage and for turning on said at least one LED when the voltage across said load resistor exceeds said reference voltage.

8. The apparatus of claim wherein said switch means comprises a make-before-break transfer switch.

9. The apparatus of claim 1, wherein said storage battery is in a vehicle.

10. The apparatus of claim 1, wherein said energy dissipation circuit further includes at least one thyristor coupled to said load resistor for increasing dissipation circuit resistance as the voltage and current in the winding decrease for rapidly and completely discharging the winding.

11. The apparatus of claim 1, wherein said energy dissipation circuit further includes at least one metal oxide varistor (MOV) coupled to said load resistor for increasing dissipation circuit resistance as the voltage and current in the winding decrease for rapidly and completely discharging the winding.

12. The apparatus of claim 1, wherein said energy dissipation circuit further includes a lightning arrester coupled to said load resistor for increasing dissipation circuit resistance as the voltage and current in the winding decrease for rapidly and completely discharging the winding.

13. The apparatus of claim 1, wherein said current and voltage measuring means comprise a passive resistance display/meter.

14. Apparatus for determining DC resistance of a high voltage inductive winding, said apparatus comprising:
   a DC voltage source;
   current measuring means coupled to the winding for measuring current therein;
   DC voltage measuring means for measuring a DC voltage;
   energy dissipation circuit means for resistively loading and dissipating a voltage provided to said circuit means;
   three position make-before-break switch means for coupling said DC voltage source to the winding when said switch is in a first position for energizing the winding and for further coupling said current measuring means and said DC voltage measuring means to the winding when said switch is in said first position, for coupling said DC voltage source, said current measuring means sand said energy dissipation circuit means to the winding when said switch means is in a second position for initiating discharge of stored winding energy, and for coupling only said energy dissipation circuit to the winding when said switch means is in a third position for completely discharging said inductive winding, wherein DC resistance of the winding can be determined from said current measuring means and said DC voltage measuring means when said switch means is in said first position; and
   visual display means coupled to said energy dissipation circuit means and responsive to a DC voltage therein for indicating when winding inductance is completely discharged.

15. The apparatus of claim 14 further comprising voltage comparison means coupling said energy dissipation circuit means to said visual display means for comparing a DC voltage in said energy dissipation circuit means to a reference voltage and for turning on said visual display means when the DC voltage exceeds said reference voltage.

16. The apparatus of claim 15 further comprising means for providing said reference voltage from said DC voltage source to said voltage comparison means.

17. The apparatus of claim 14 wherein said visual display means includes a light emitting diode (LED).

18. The apparatus of claim 14, wherein said visual display means comprises an expandable scale voltmeter.

* * * * *

UNITED STATES PATENT AND TRADEMARK OFFICE
CERTIFICATE OF CORRECTION

PATENT NO. : 5,172,067
DATED : December 15, 1992
INVENTOR(S) : Willard G. Hoffmann It is certified that error appears in the above-indentified patent and that said Letters Patent is hereby corrected as shown below:

Column 4, line 60, after "circuit", insert --11--.

Column 7, line 63, "2" should be --3--.

Column 8, line 8, after "claim", insert --1,--.

Signed and Sealed this

Twenty-sixth Day of October, 1993

Attest:

BRUCE LEHMAN

Attesting Officer     Commissioner of Patents and Trademarks